(12) United States Patent
Kim et al.

(10) Patent No.: US 7,033,896 B2
(45) Date of Patent: Apr. 25, 2006

(54) FIELD EFFECT TRANSISTOR WITH A HIGH BREAKDOWN VOLTAGE AND METHOD OF MANUFACTURING THE SAME

(75) Inventors: Ji-Su Kim, Gangneung-si (KR); Sung-Hoan Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/935,890

(22) Filed: Sep. 8, 2004

(65) Prior Publication Data
US 2005/0062104 A1    Mar. 24, 2005

(30) Foreign Application Priority Data
Sep. 23, 2003    (KR)    .................... 10-2003-0065891

(51) Int. Cl.
*H01L 21/336*    (2006.01)
*H01L 29/76*    (2006.01)

(52) U.S. Cl. ............ 438/301; 438/305; 438/318; 438/391; 438/447; 257/288; 257/E29.148; 257/E29.149

(58) Field of Classification Search .............. None
See application file for complete search history.

(56) References Cited

U.S. PATENT DOCUMENTS

| 5,635,417 | A | 6/1997 | Natsume | 438/130 |
| 6,465,311 | B1 * | 10/2002 | Shenoy | 438/300 |
| 6,483,158 | B1 * | 11/2002 | Lee | 257/408 |

FOREIGN PATENT DOCUMENTS

| JP | 7-122657 | 5/1995 |
| KR | 00206957 | 4/1999 |
| KR | 00216321 | 5/1999 |
| KR | 2001-0084781 | 9/2001 |

* cited by examiner

*Primary Examiner*—David Nelms
*Assistant Examiner*—Long Tran
(74) *Attorney, Agent, or Firm*—Mills & Onello LLP

(57) ABSTRACT

An electric field effect transistor of high breakdown voltage and a method of manufacturing the same are disclosed. A recessed portion is formed at the channel region and is filled by a protective oxide layer. Lightly doped source/drain regions are formed under the protective oxide layer. The protective oxide layer protects the lightly doped source/drain regions. Accordingly, the protective oxide layer prevents the electric field from being concentrated to a bottom corner portion of the gate structure. In addition, the effective channel length is elongated since an electric power source is connected to heavily doped source/drain regions from an outside source of the transistor, instead of being connected to lightly doped source/drain regions.

9 Claims, 10 Drawing Sheets

FIELD EFFECT TRANSISTOR WITH A HIGH BREAKDOWN VOLTAGE AND METHOD OF MANUFACTURING THE SAME

CROSS-REFERENCE OF RELATED APPLICATIONS

This application relies for priority upon Korean Patent Application No. 2003-65891 filed on Sep. 23, 2003, the content of which are herein incorporated by reference in its entirety.

BACKGROUND OF THE INVENTION

1. Field of the Invention

The present invention relates to a field effect transistor and a method of manufacturing the same. More particularly, the present invention relates to a field effect transistor with high breakdown voltage, and a method of manufacturing the same.

2. Description of the Related Art

In general, a metal oxide semiconductor field effect transistor (MOSFET) includes three different operation regions.

Figure 1:
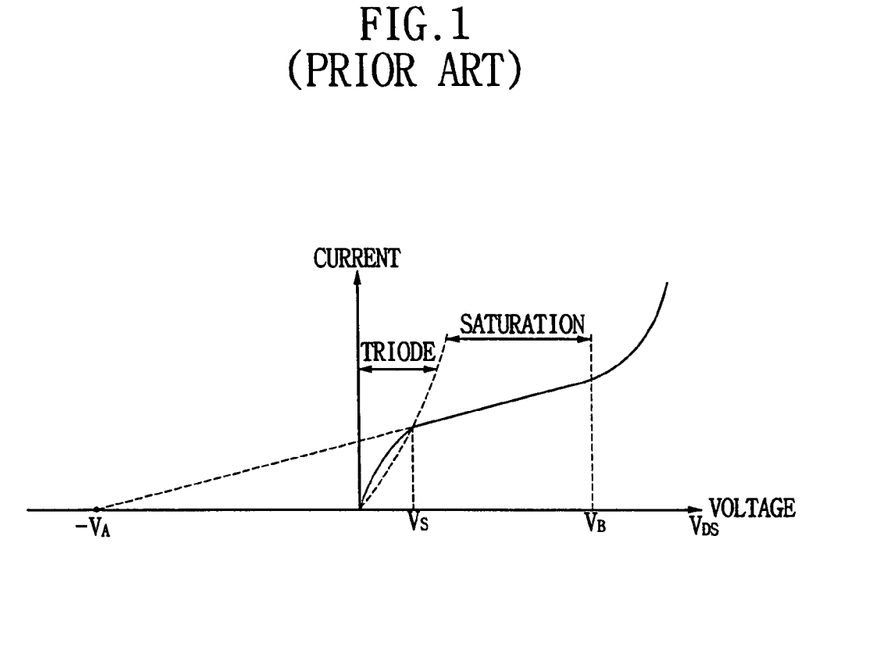
FIG. 1 is a graph illustrating an electrical characteristic of the drain in an N channel enhancement type MOSFET.

FIG. 1 is a graph illustrating an electrical characteristic of a drain in an N channel enhancement type MOSFET.

As shown in FIG. 1, in the N channel enhancement type MOSFET, an inversion layer that is a conductive channel in a transistor is formed in a portion of the channel of the MOSFET, and the MOSFET is operated on condition that the threshold voltage $V_t$ is positive and a voltage $V_{gs}$ between gate and source of the MOSFET is over the threshold voltage $V_t$.

When the voltage $V_{gs}$ is less than the threshold voltage $V_t$, the inversion layer is not formed and a current does not pass through the MOSFET. The region in which the voltage $V_{gs}$ is less than the threshold voltage $V_t$ is referred to as a cut-off region.

When the voltage $V_{gs}$ is greater than the threshold voltage $V_t$ and the MOSFET is operated, the amount of current passing though the MOSFET is determined in accordance with a voltage difference between the source and drain $V_{ds}$. In the case in which the voltage difference $V_{ds}$ is relatively low, the current is linearly proportional to the voltage difference $V_{ds}$. The region in which the current is linearly proportional to the voltage difference $V_{ds}$ is referred to as a triode region.

As the voltage difference $V_{ds}$ increases, a depth of the channel around the drain gradually decreases. Finally, when the voltage difference $V_{ds}$ is greater than a saturation voltage $V_s$ corresponding to the voltage difference between the voltage $V_{gs}$ and the threshold voltage $V_t$, the channel around the drain is pinched off. As a result, a depletion region instead of the inversion layer is formed in the channel, and electrons are moved through the depletion region by the voltage applied to the depletion layer. In addition, the amount of current passing through the MOSFET is not effective on an increase of the voltage difference Vds, and the MOSFET operates just like a static current source. The region in which the current amount does not affect on the increase of the $V_{ds}$ is referred to as a saturation region.

When the $V_{ds}$ is increased over the saturation region, the pinch-off region of the channel is gradually enlarged, thus the channel is shortened. The shortening of the channel is generally referred to as channel length modulation. As the channel is shortened, the depletion region between the channel and the drain is enlarged, and the current Ids passing through the channel slightly increases as the voltage $V_{ds}$ increases.

In the case in which the voltage $V_{ds}$ is greater than a predetermined voltage $V_B$, the inversion layer disappears and only the depletion region is formed between the source and the drain of the MOSFET, thus the current of the drain exceeds the saturation current $I_{ds}$ due to a current leakage at the drain of the MOSFET. The depletion region between the drain and the source of the MOSFET reduces the energy barrier that prevents the electrons from being moved, thus the current leaks from the drain. The current leakage from the drain is detected especially when the channel length is less than or equal to about 2 μm. As the voltage $V_{ds}$ increases, the energy barrier also decreases, thereby increasing the leakage current. However, the leaking current is not substantially proportional to the increase of the voltage $V_{ds}$, which is referred to as a punch-through or as a soft breakdown.

When the voltage $V_{ds}$ continuously increases over the soft breakdown, the channel is broken down due to an avalanche effect. As the voltage $V_{ds}$ increases, an electric field intensity in the MOSFET becomes higher around the corner of the drain than at a central portion of the channel. The high intensity of the electric field increases the kinetic energy of a charge carrier much more than the kinetic energy at room temperature. The charge carrier of high kinetic energy is usually referred to as a hot-carrier. A plurality of the hot-carriers are supplied onto a surface of the substrate, and impact the atoms of the substrate to thereby generate a plurality of electron hole pairs, which is referred to as an avalanche effect.

In the case of an N type MOSFET, holes accumulated on a P type substrate generate a forward-biased voltage between the source and the substrate. When the forward-biased voltage between the source and the substrate is about 0.6V, the electrons move from the source to the substrate. The movement of the electrons from the source to the substrate causes the same result as a bipolar npn transistor in parallel with the MOSFET. Accordingly, supplying even a small quantity of the holes to the substrate corresponding to a base of the transistor causes a large amount of current between an emitter and a collector, which is referred to as a conventional operation of a bipolar junction transistor. In the same way, a little increase of the voltage between the drain and the source generates a large amount of current in the channel, which is referred to as a channel breakdown.

As described in the above, the increase of the voltage for channel breakdown requires an increase of the channel length. In addition, the hot-carrier due to the high electric field intensity at the corner portion of the drain is prevented from being generated so as to increase the voltage for the channel breakdown. Therefore, a transistor structure is required to lower the electric field intensity at the corner portion of the drain.

The channel length increase is not suitable for increasing the voltage for the channel breakdown according to a technological trend of the high integration in semiconductor devices since the area occupied by a transistor is enlarged. Korean Patent No. 10-0206957 discloses a semiconductor device and a method of fabricating the same, wherein the semiconductor device has a high breakdown voltage without enlarging the transistor area. According to the disclosure in the above Korean Patent, two trench structures are formed in an active region of the substrate, and lightly doped source/drain regions are formed at a bottom portion of the trench structure to thereby elongate the effective channel length.

However, the above Korean Patent does not disclose a method of protecting the lightly doped source/drain regions in a subsequent process, nor does it disclose a transistor structure for lowering the electric field intensity at the corner portion of the drain.

SUMMARY OF THE INVENTION

Accordingly, the present invention provides a field effect transistor of a high breakdown voltage.

The present invention also provides a method of manufacturing a transistor of a high breakdown voltage.

According to an aspect of the present invention, a transistor with a high breakdown voltage, comprises a semiconductor substrate having a trench which defines an active region and an insulation layer filling the trench. At least one recessed portion is disposed in the active region. A gate structure is disposed on a central portion of the active region, and a protective oxide layer is disposed between the gate structure and the insulation layer, the recessed portion being filled with the protective oxide layer. Lightly doped source/drain regions are disposed at surface portions of the substrate around the protective oxide layer. Heavily doped source/drain regions are disposed at surface portions of the semiconductor substrate between the protective oxide layer and the insulation layer.

According to another aspect of the present invention, a method of manufacturing a transistor with a high breakdown voltage is provided. An active region is defined on a semiconductor substrate by an isolation layer formed in a trench with an insulation material. A surface of the active region is selectively etched, thereby forming at least one recessed portion in the active region of the substrate. An oxide material is deposited on a surface of the substrate, thereby forming an oxide layer with which the recessed portion is filled. Ions are lightly implanted to the recessed portion of the substrate including the oxide layer, thereby forming lightly doped source/drain regions at surface portions of the recessed portion. The oxide layer except for a portion of the oxide layer corresponding to the recessed portion is removed, thereby forming a protective oxide layer on the recessed portion. A gate structure is formed between the protective oxide layers, and ions are heavily implanted into the substrate between the protective oxide layer and the insulation layer, thereby forming heavily doped source/drain regions on the semiconductor substrate.

According to still another aspect of the present invention, a method of manufacturing a transistor with a high breakdown voltage is provided. A trench for isolating devices is filled with insulation material, thus an active region is defined on a semiconductor substrate. A surface portion of the substrate in the active region is selectively etched, thereby forming a recessed portion at left and right portions of the substrate in the active region. A screen oxide layer is formed on the substrate including the recessed portion. Ions are lightly implanted to the recessed portion including the screen oxide layer, thereby forming lightly doped source/drain regions on a surface portion of the recessed portion. The screen oxide layer is removed, and a surface of the substrate on which the recessed portion is formed is exposed. An oxide material is deposited on the surface of the substrate, thereby filling the recessed portion with the oxide material. The oxide material except for the oxide material with which the recessed portion is filled is removed from the surface of the substrate in the active region, thereby forming a protective oxide layer on a surface of the recessed portion. A gate structure is formed between the protective oxide layers. Ions are heavily implanted into the substrate, thereby forming heavily doped source/drain regions on a surface portion between the protective oxide layer and the insulation layer.

According to the present invention, a protective oxide layer is formed at a lightly doped region, so that the lightly doped region is prevented from being damaged in a subsequent process and an effective channel length is elongated to thereby increase breakdown voltage of an electric field effect transistor. In addition, the electric field is prevented from being concentrated to a bottom portion of a gate structure, so that the generation of hot carriers is suppressed to thereby increase the breakdown voltage of the electric field effect transistor.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DESCRIPTION OF THE EXEMPALRY EMBODIMENTS

The present invention now will be described more fully hereinafter with reference to the accompanying drawings, in which exemplary embodiments of the present invention are shown.

Embodiment 1

Figure 2:
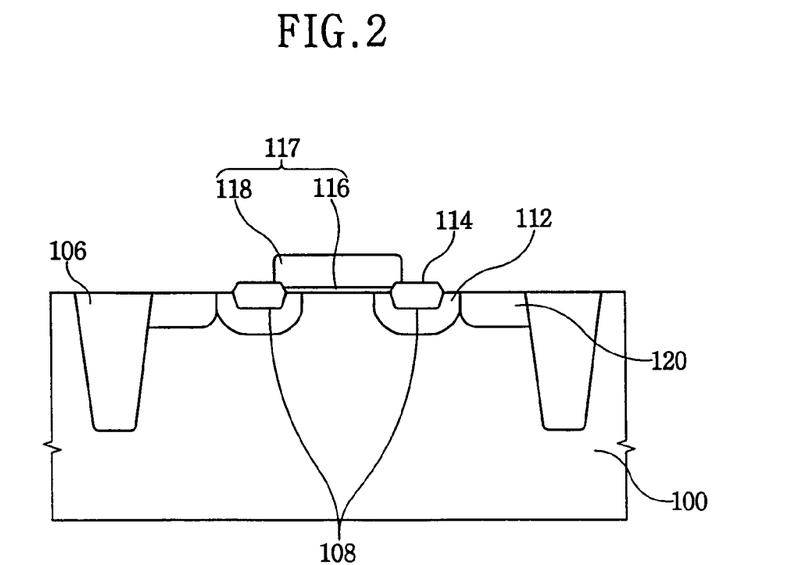
FIG. 2 is a cross sectional view schematically illustrating an electric field effect transistor according to a first embodiment of the present invention.

FIG. 2 is a cross sectional view schematically illustrating an electric field effect transistor according to a first embodiment of the present invention.

Referring to FIG. 2, a trench is formed at a surface portion of the semiconductor substrate 100, and the trench is filled with an insulation material. An insulation layer 106 is formed along the trench, and the insulation layer 106 defines an active region on the substrate 100 as an isolation layer. As an exemplary embodiment, the insulation layer 106 includes silicon dioxide ($SiO_2$). At least a recessed portion 108 is disposed on the substrate in the active region. The electric field effect transistor is disposed corresponding to the recessed portion 108 in the active region.

A gate structure 117 is disposed at a central portion of the active region. The gate structure 117 includes a dielectric layer 116 formed on a channel region through which an electron or a hole passes between a source region and a drain region of the transistor, and a conductive layer 118 formed on the dielectric layer 116. The gate structure 117 may further include a sidewall spacer (not shown) when necessary, and a hard mask layer (not shown) on the conductive layer 118.

A protective oxide layer 114 is disposed between the gate structure 117 and the insulation layer 106 in the trench. As an exemplary embodiment, the recessed portion 108 is filled with the protective oxide layer 114, and a sidewall of the gate structure 117 is disposed corresponding to the protective oxide layer 114. The protective oxide layer 114 has a convex shape on a surface of the substrate 100, and a pair of the protective oxide layer is disposed in the active region. As an exemplary embodiment, the protective oxide layer includes silicon dioxide ($SiO_2$). An $n^-/p^-$ region 112 that is a lightly doped region is disposed at a surface portion of the substrate around the protective oxide layer 114. The recessed portion 108 has vertical profile with respect to the surface of the substrate 100. For example, an area of an upper portion of the recessed portion 108 is larger than that of a lower portion of the recessed portion 108 so as to diversify an electric field at both sides of the gate structure.

An $n^+/p^+$ region 120 that is a heavily doped region is disposed at a surface portion of the substrate between the protective layer 114 and the insulation layer 106, and makes contact with the lightly doped $n^-/p^-$ region 112.

According to the above-described electric field effect transistor, the protective oxide layer 114 is disposed between the corner portion of the drain and the gate structure, so that the channel breakdown due to the hot carrier minimally occurs. In addition, the lightly doped region 112 is formed under the protective oxide layer 114, thus the effective channel length is elongated to thereby increase the channel breakdown voltage.

FIGS. 3A to 3I are cross sectional views schematically illustrating steps of a method of manufacturing the electric field effect transistor according to the first embodiment of the present invention.

Figure 3A:
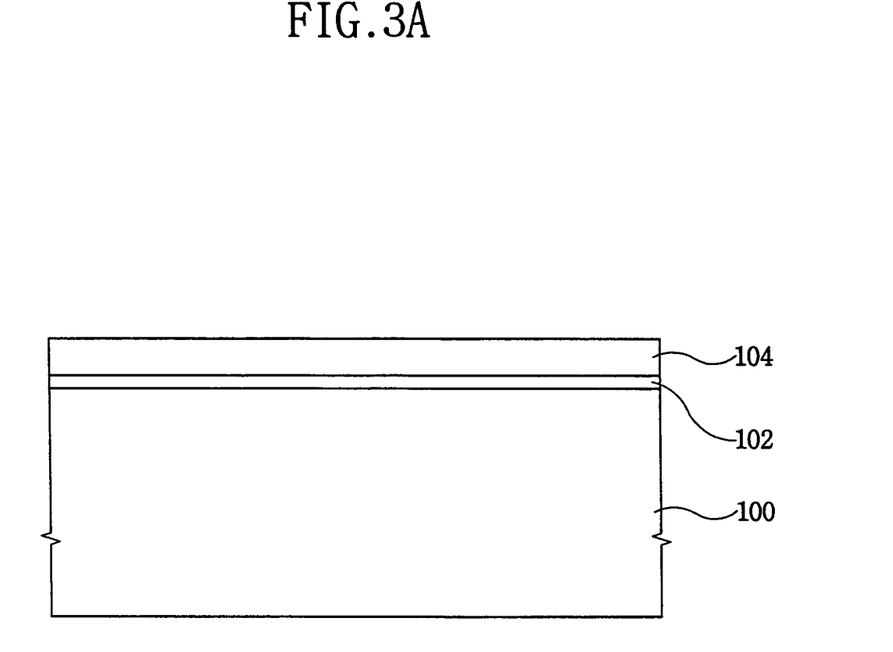
FIGS. 3A to 3I are cross sectional views schematically illustrating steps of a method of manufacturing the electric field effect transistor as shown in FIG. 2.

Referring to FIG. 3A, a pad oxide layer 102 and a nitride layer 104 are sequentially formed on a surface of a semiconductor substrate 100. The pad oxide layer 102 functions as a stress buffer for preventing a thermal stress on the substrate 100. The difference of thermal expansion between the substrate 100 and the nitride layer 104 causes an internal stress on the substrate 100, and the pad oxide layer 102 absorbs the internal stress between the substrate 100 and the nitride layer 104 to thereby prevent the thermal stress on the substrate 100. As an exemplary embodiment, the pad oxide layer 102 is formed via a dry oxidation process. That is, oxygen is supplied onto a surface of the substrate 100 at a temperature of about 900° C. to about 1200° C., and the substrate surface is oxidized to thereby form the pad oxide layer 102 on the substrate.

As an exemplary embodiment, the nitride layer 104 includes silicon nitride (SiN), and is coated on the pad oxide layer 102 by using a chemical vapor deposition, physical vapor deposition, or an atomic layer deposition process.

Figure 3B:
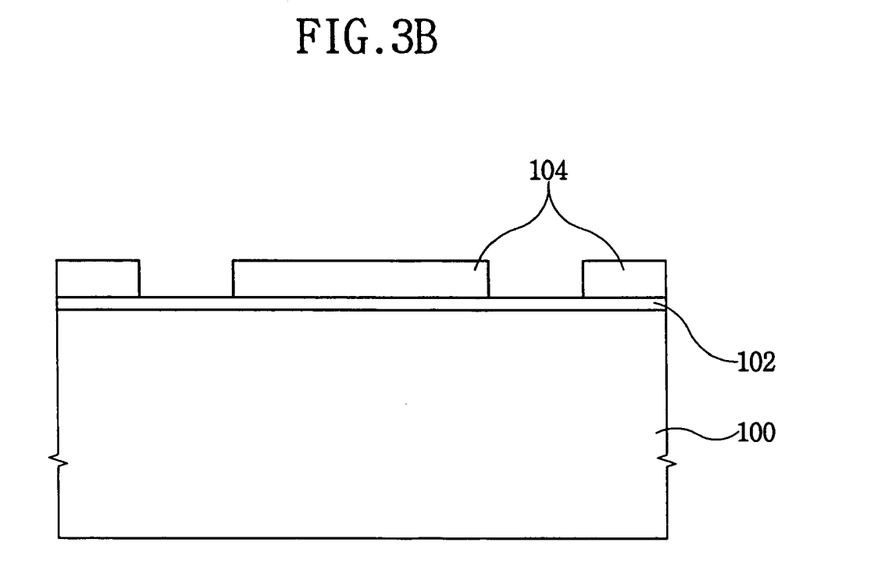

Referring to FIG. 3B, a photoresist film is formed on the nitride layer 104, and is patterned to partially expose the nitride layer 104. Then, an etching process is performed using the nitride layer 104 as a mask, and the pad oxide layer 102 is partially exposed.

Figure 3C:
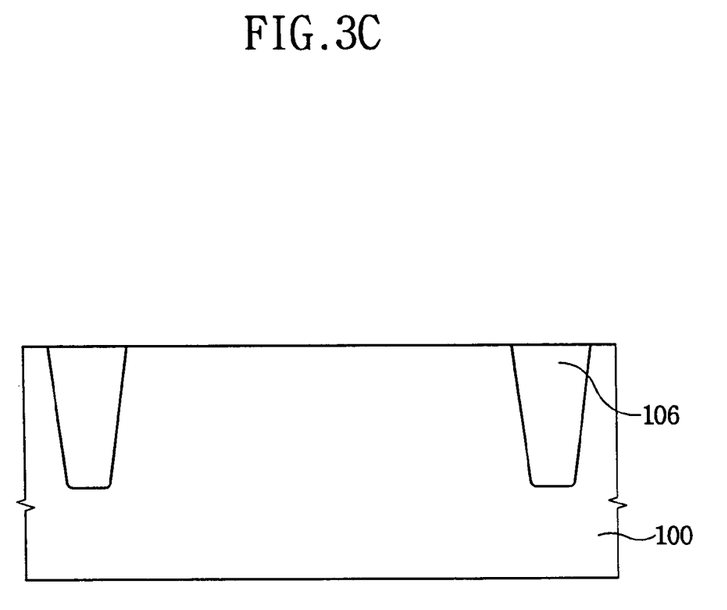

Referring to FIG. 3C, the exposed pad oxide layer and the substrate under the exposed pad oxide layer are sequentially etched away, thereby forming a trench at a surface portion of the substrate. Then, the photoresist film on the substrate is removed; and the substrate is thermally treated in an oxidation atmosphere. Therefore, crystalline defects at a bulk region around the trench are cured.

An insulation material is deposited on the nitride layer such that the trench is completely filled with the insulation material, so that an insulation layer 106 is coated on the nitride layer to a thickness for completely filling up the trench. The insulation material may be deposited on the nitride layer by a spin-on glass (SOG) process. Subsequently, an etch-back process or a planarization process is performed on the insulation layer 106, and the insulation layer 106 is removed from the nitride layer. As an exemplary embodiment, the insulation layer 106 is removed by a chemical mechanical polishing process using the nitride layer as a stopper. The nitride layer and the pad oxide layer are removed from the surface of the substrate 100, thereby forming the insulation layer 106 on the substrate 100. The insulation layer 106 defines an active region on the substrate 100, and the insulation layer 106 exemplarily includes silicon dioxide ($SiO_2$).

Figure 3D:
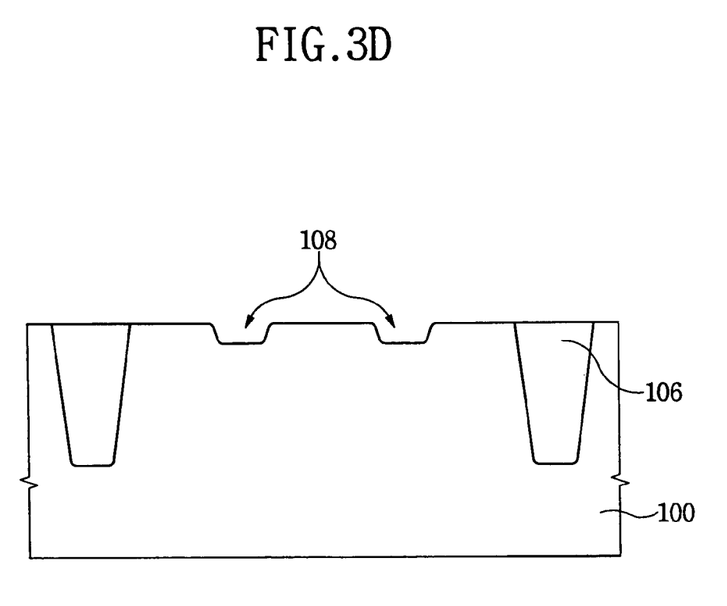

Referring to FIG. 3D, a recessed portion 108 is formed at a surface portion of the substrate 100 in the active region. A photoresist film is coated and patterned on the substrate 100 in the active region, so that the surface portion of the substrate is partially exposed. An etching process is performed using the photoresist pattern as a mask, so that the surface portion of the substrate 100 is etched away to thereby form the recessed portion 108 on the substrate 100. As an exemplary embodiment, a pair of the recessed portion 108 is formed at both side portions of the active region. The photoresist film is removed from the substrate 100 after a photolithography process is completed.

Figure 3E:
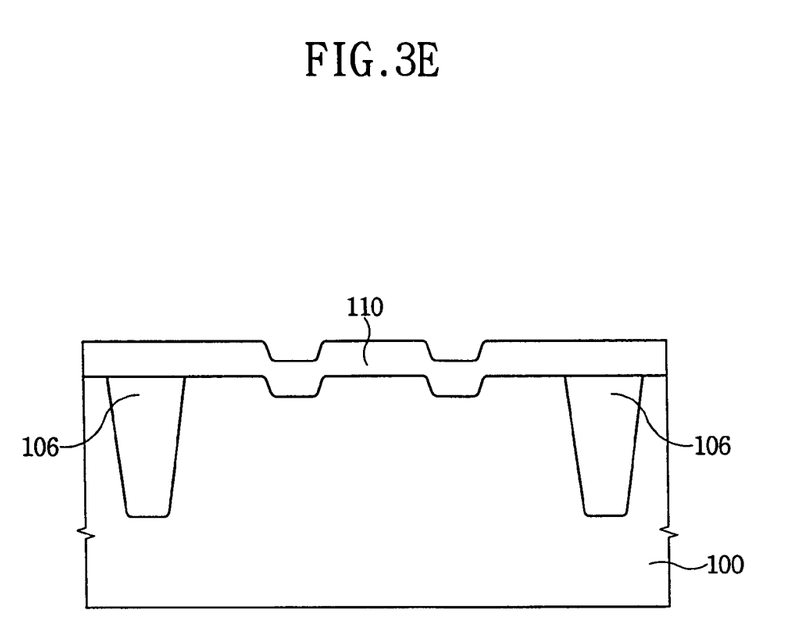

Referring to FIG. 3E, an oxide material is deposited on the surface of the substrate 100, thus an oxide layer 110 is formed on the substrate 100. The oxide material is deposited such that the recessed portion 108 is completely filled with the oxide material, so that the oxide layer 110 completely covers the recessed portion 108. For example, the oxide material includes silicon dioxide ($SiO_2$).

Figure 3F:
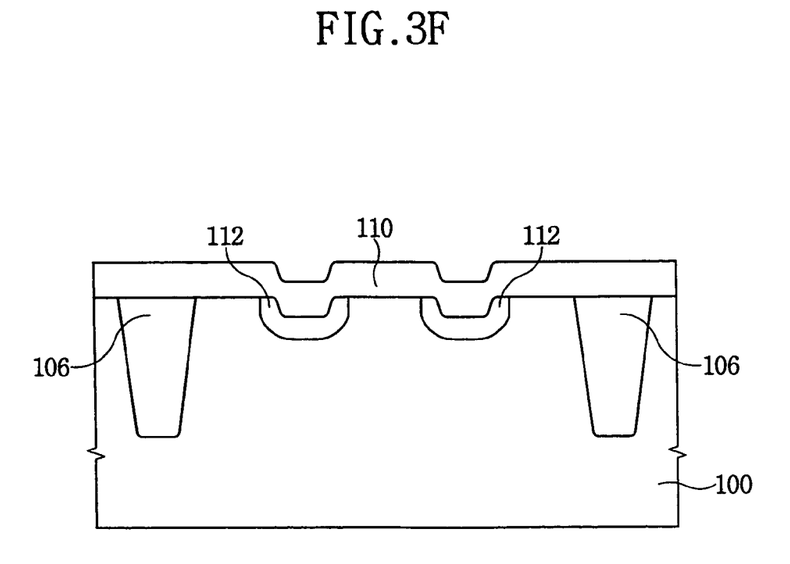

Referring to FIG. 3F, a photoresist film is formed on the oxide layer 110 and is patterned such that the oxide layer 110 corresponding to the recessed portion 108 is exposed. An implantation process is performed and a plurality of ions is implanted onto the exposed oxide layer 110 with sufficient energy for forming a lightly doped region under the recessed portion 108. Therefore, an $n^-/p^-$ region 112 that is a lightly doped region is formed at a surface portion of the substrate 100 corresponding to a lower portion of the recessed portion 108. A pair of the $n^-/p^-$ region 112 forms the lightly doped source/drain regions of the transistor.

Figure 3G:
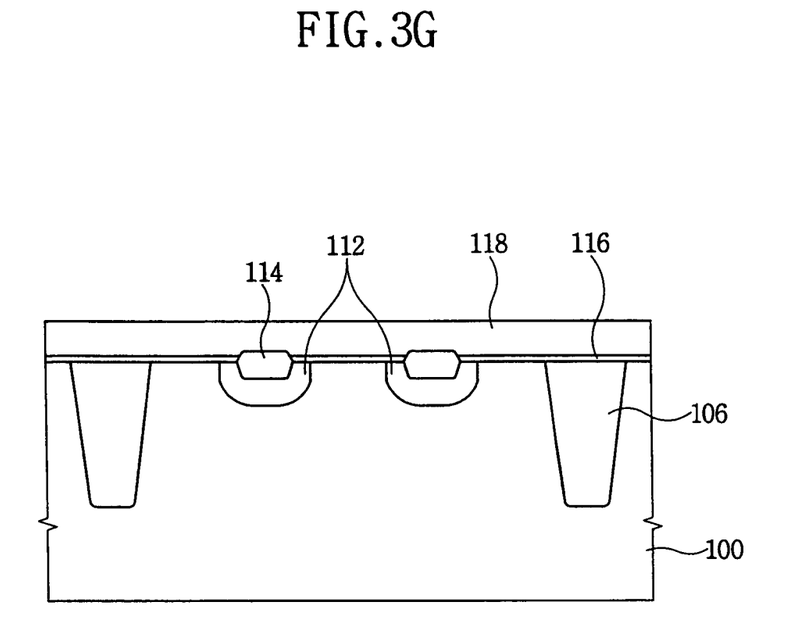

Referring to FIG. 3G, a photoresist film is formed on the oxide layer 110 and is patterned such that all of the oxide layer 110 except for a portion of the oxide layer 110 corresponding to the recessed portion 108 is exposed. An etching process is performed using the photoresist pattern as a mask, thus most of the oxide layer 110 is removed, and remaining oxide layer 110 on the recessed portion 108 forms a protective oxide layer 114 with which the recessed portion is filled.

Then, a dielectric layer 116 is coated on the substrate 100 and the protective oxide layer 114, and a conductive layer 118 is coated on the dielectric layer 116. For example, the dielectric layer 116 includes silicon dioxide ($SiO_2$), and the conductive layer 118 includes polycrystalline silicon.

As an exemplary embodiment, a dielectric is grown on the semiconductor substrate 100 in an oxidation atmosphere at a high temperature, and the same material as the grown dielectric is deposited on the substrate 100, thereby forming the dielectric layer 116.

Figure 3H:
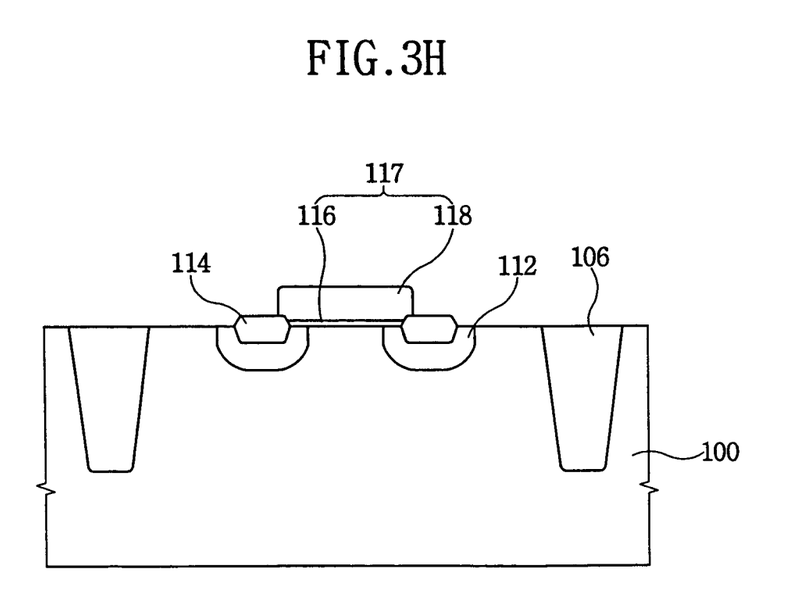

Referring to FIG. 3H, a photoresist film is also coated and patterned on the conductive layer, and an etching process is performed using the photoresist pattern as a mask. Therefore, the gate structure including the dielectric layer 116 and the conductive layer 118 is formed between the pair of protective oxide layer 114. In addition, the gate structure further includes a sidewall spacer when necessary or a hard mask layer on the conductive layer 118.

Figure 3I:
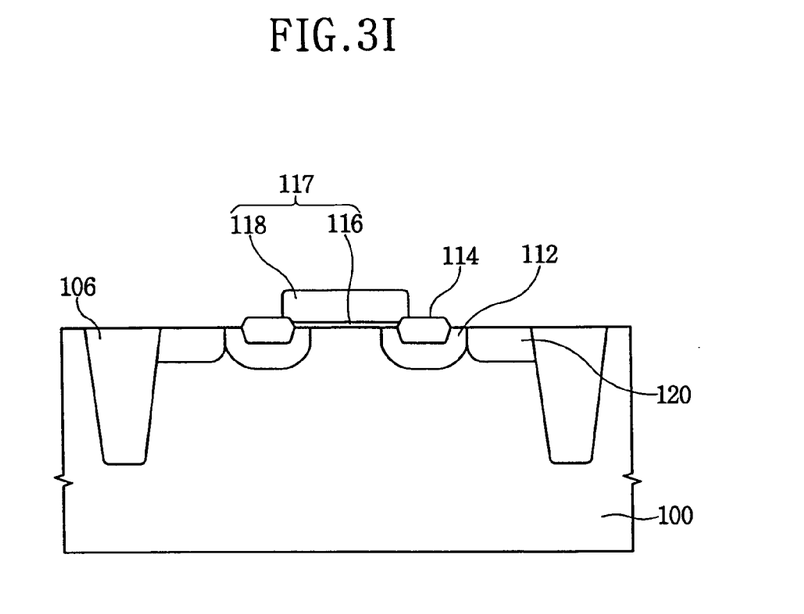

Referring to FIG. 3I, a photoresist film is also coated on an entire surface of the substrate 100, and a photoprocess is performed on the photoresist film in such a pattern that some portion of the substrate that is to be heavily source/drain regions is opened between the protective oxide layer 114 and the insulation layer 106. An implantation process is performed and a plurality of ions is implanted onto the exposed portions of the substrate 100 with sufficient energy for forming a heavily doped region at a surface portion of the substrate 100. Therefore, an $n^+/p^+$ region 120 that is a heavily doped region is formed at a surface portion of the substrate 100 between the protective oxide layer 114 and the insulation layer 106. A pair of the $n^+/p^+$ region 120 forms the heavily doped source/drain regions with which a conductive line of an electric circuit in the transistor makes contact.

Embodiment 2

FIGS. 4A to 4I are cross sectional views schematically illustrating steps of a method of manufacturing the electric field effect transistor according to the second embodiment of the present invention.

Figure 4A:
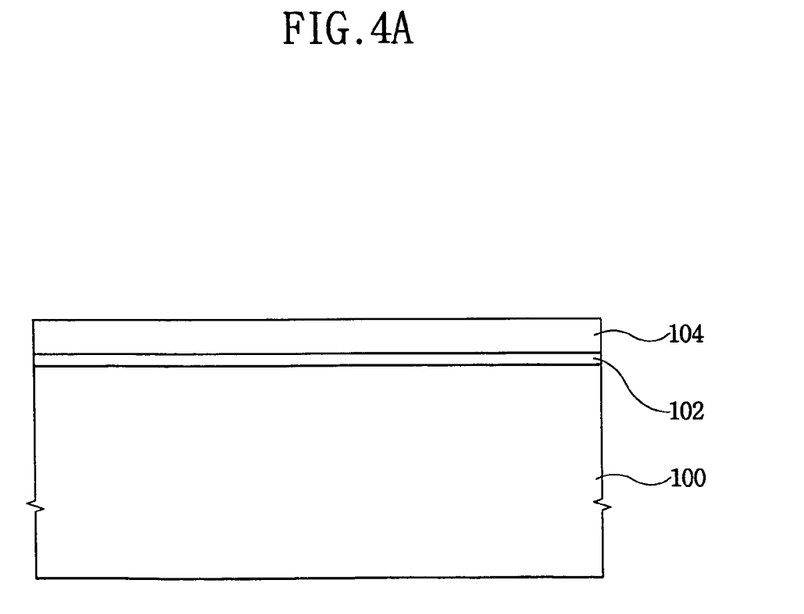
FIGS. 4A to 4I are cross sectional views schematically illustrating steps of a method of manufacturing the electric field effect transistor as shown in FIG. 2 according to a second embodiment of the present invention.

Referring to FIG. 4A, a pad oxide layer 102 and a nitride layer 104 are sequentially formed on a surface of a semiconductor substrate 100. The pad oxide layer 102 functions as a stress buffer for preventing a thermal stress on the substrate 100. A thermal expansion difference between the substrate 100 and the nitride layer 104 causes an internal stress on the substrate 100, and the pad oxide layer 102 absorbs the internal stress between the substrate 100 and the nitride layer 104 thereby to prevent the generation of the thermal stress at the substrate 100. As an exemplary embodiment, the pad oxide layer 102 is formed by a dry oxidation process. That is, oxygen is supplied onto a surface of the substrate 100 at a temperature of about 900° C. to about 1200° C., and the substrate surface is oxidized to form the pad oxide layer 102 on the substrate 100.

As an exemplary embodiment, the nitride layer 104 includes silicon nitride (SiN), and is coated on the pad oxide layer 102 by using a chemical vapor deposition, physical vapor deposition, or an atomic layer deposition process.

Figure 4B:
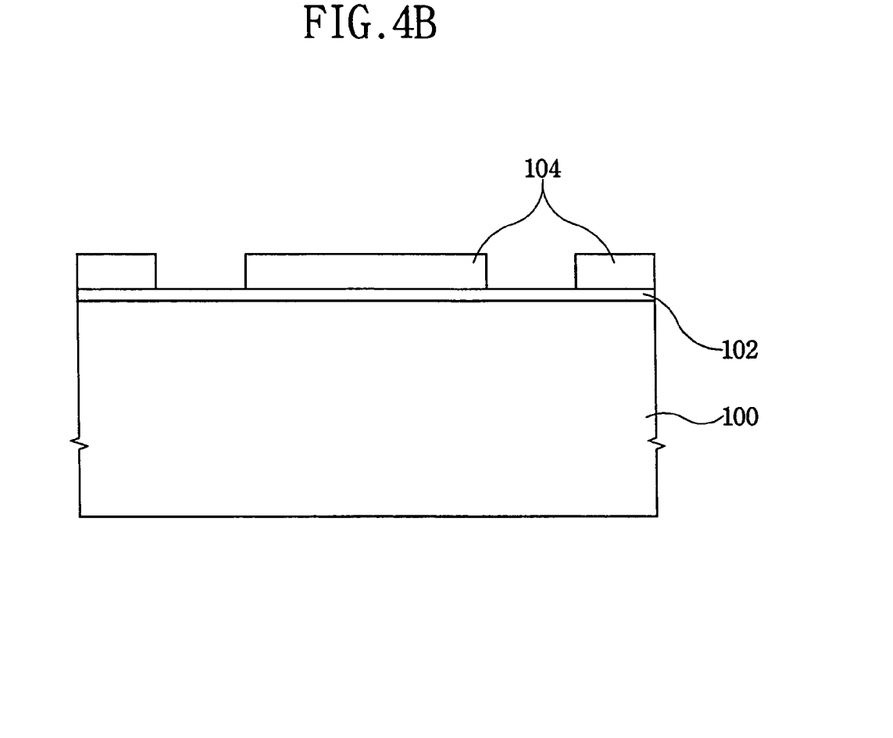

Referring to FIG. 4B, a photoresist film is formed on the nitride layer 104, and is patterned to thereby partially expose the nitride layer 104. Then, an etching process is performed using the nitride layer 104 as a mask, and the pad oxide layer 102 is partially exposed.

Figure 4C:
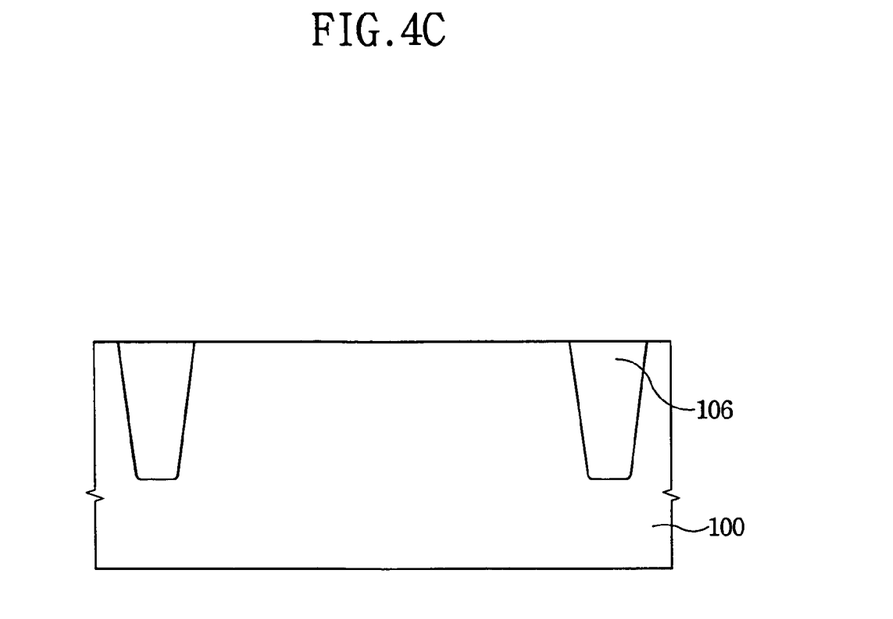

Referring to FIG. 4C, the exposed pad oxide layer and the substrate under the exposed pad oxide layer are sequentially etched away, thereby forming a trench at a surface portion of the substrate 100. Then, the photoresist film on the substrate 100 is removed, and the substrate 100 is thermally treated in an oxidation atmosphere. Therefore, crystalline defects at a bulk region around the trench are cured.

An insulation material is deposited on the nitride layer 104 such that the trench is completely filled with the insulation material, so that an insulation layer 106 is coated on the nitride layer 104 to a thickness for completely filling up the trench. The insulation material may be deposited on the nitride layer 104 by a spin-on glass (SOG) process. Subsequently, an etch-back process or a planarization process is performed on the insulation layer 106, and the insulation layer 106 is removed from the nitride layer 104. As an exemplary embodiment, the insulation layer 106 is removed by a chemical mechanical polishing process using the nitride layer 104 as a stopper. The nitride layer 104 and the pad oxide layer 102 are removed from the surface of the substrate 100, thereby forming the insulation layer 106 on the substrate 100. The insulation layer 106 defines an active region on the substrate 100, and the insulation layer 106 exemplarily includes silicon dioxide ($SiO_2$).

Figure 4D:
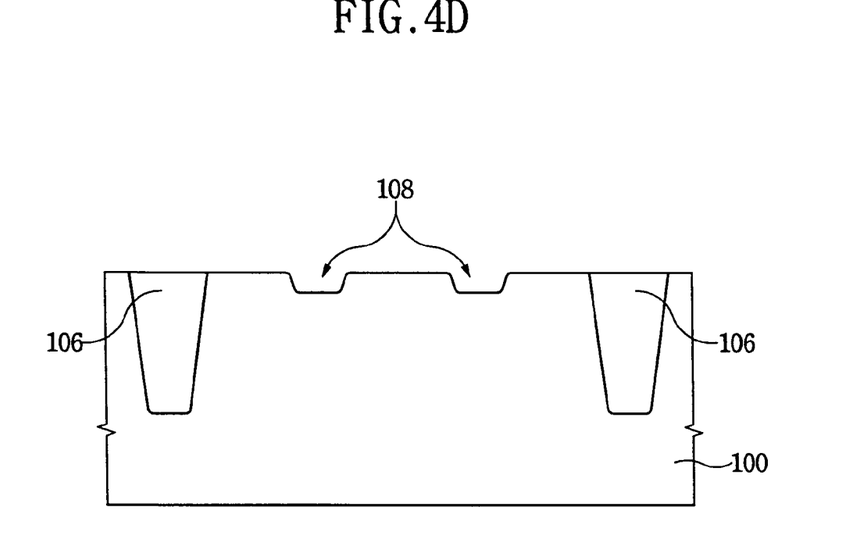

Referring to FIG. 4D, a recessed portion 108 is formed on a surface portion of the substrate 100 in the active region. A photoresist film is coated and patterned on the substrate in the active region and, so that the surface portion of the substrate is partially exposed. An etching process is performed using a photoresist pattern as a mask, and the surface portion of the substrate 100 is etched away to thereby form the recessed portion 108 on the substrate 100. As an exemplary embodiment, a pair of the recessed portion 108 is formed at both side portions of the active region. The photoresist film is removed from the substrate after a photolithography process is completed.

Figure 4E:
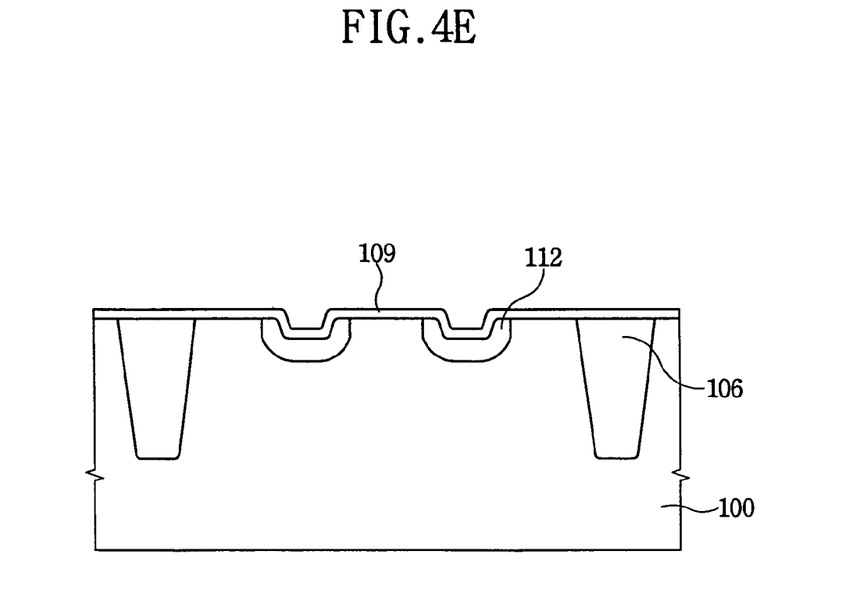

Referring to FIG. 4E, a screen oxide layer 109 is formed on the substrate 100 including the recessed portion 108. As an exemplary embodiment, the screen oxide layer 109 is formed by a dry oxidation process. That is, an oxidation substance is generated by a deposition process or in an oxide ambient of a high temperature, and the oxidation substance is grown to thereby form the screen oxide layer 109. The screen oxide layer 109 prevents the substrate 100 from being damaged due to high energy in a subsequent ion implantation process. As an exemplary embodiment, the screen oxide layer 109 includes a silicon dioxide ($SiO_2$). A photoresist film is also coated on the screen oxide layer 109, and is patterned such that the screen oxide layer 109 corresponding to the recessed portion 108 is exposed. An implantation process is performed and a plurality of ions is implanted onto the exposed screen oxide layer 109 with sufficient energy for forming a lightly doped region under the recessed portion 108. Therefore, an $n^-/p^-$ region 112 that is a lightly doped region is formed at a surface portion of the substrate 100 corresponding to a lower portion of the recessed portion 108. A pair of the $n^-/p^-$ region 112 forms the lightly doped source/drain regions of the transistor.

Figure 4F:
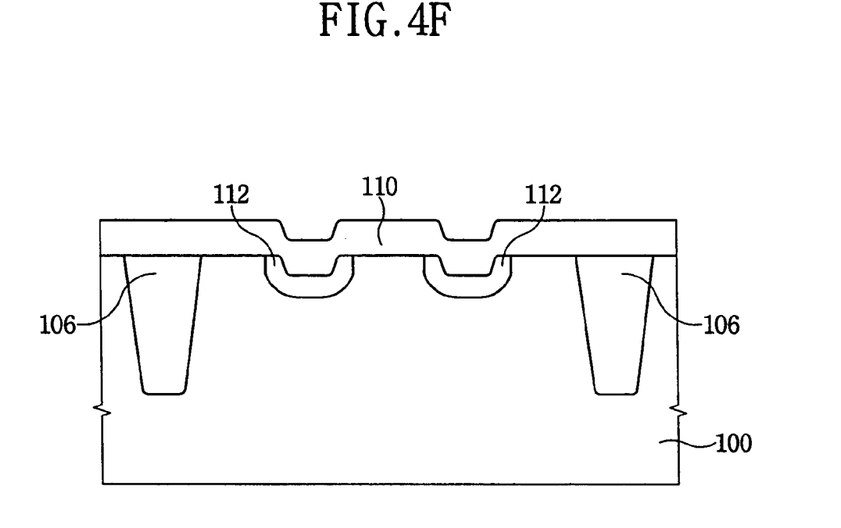

Referring to FIG. 4F, the screen oxide layer 109 is removed from the substrate 100, and an oxide layer 110 is formed on the substrate 100 until the recessed portion 108 is completely filled.

Figure 4G:
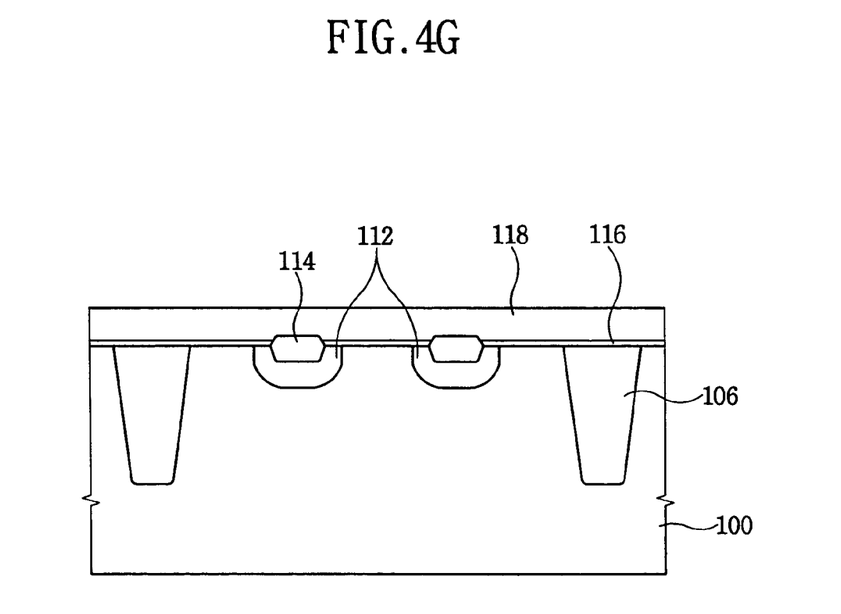

Referring to FIG. 4G, a photoresist film is formed on the oxide layer 110 and is patterned such that all of the oxide layer 110 except for a portion of the oxide layer corresponding to the recessed portion 108 is exposed. An etching process is performed using the photoresist pattern as a mask, thus most of the oxide layer 110 is removed, and remaining oxide layer on the recessed portion 108 forms a protective oxide layer 114 with which the recessed portion is filled.

Subsequently, a dielectric layer 116 is coated on the substrate 100 and the protective oxide layer 114, and a conductive layer 118 is coated on the dielectric layer 116. For example, the dielectric layer 116 includes silicon dioxide ($SiO_2$), and the conductive layer 118 includes polycrystalline silicon.

As an exemplary embodiment, a dielectric is grown on the semiconductor substrate 100 in an oxidation atmosphere at a high temperature, and same material as the grown dielectric is deposited on the substrate 100, thereby forming the dielectric layer 116.

Figure 4H:
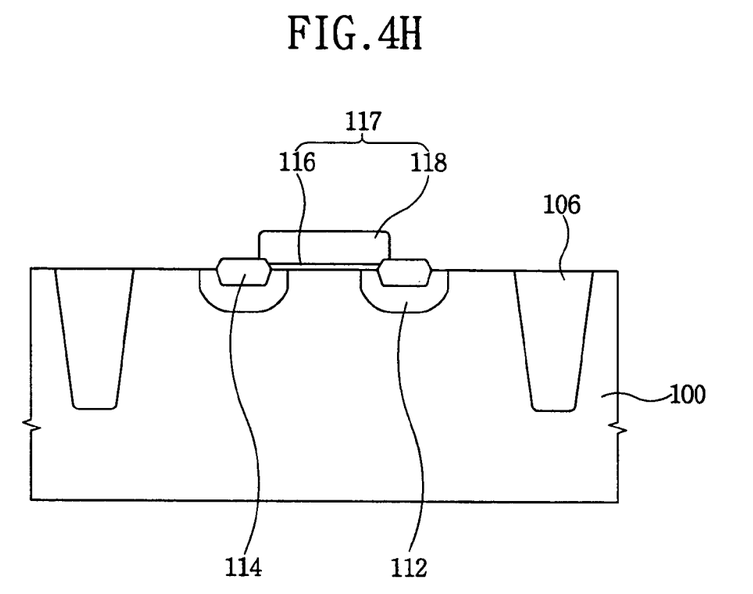

Referring to 4H, a photoresist film is also coated and patterned on the conductive layer 118, and an etching process is performed using the photoresist pattern as a mask. Therefore, the gate structure including the dielectric layer 116 and the conductive layer 118 is formed between the pair of protective oxide layers 114. In addition, the gate structure further includes a sidewall spacer when necessary or a hard mask layer on the conductive layer 118.

Figure 4I:
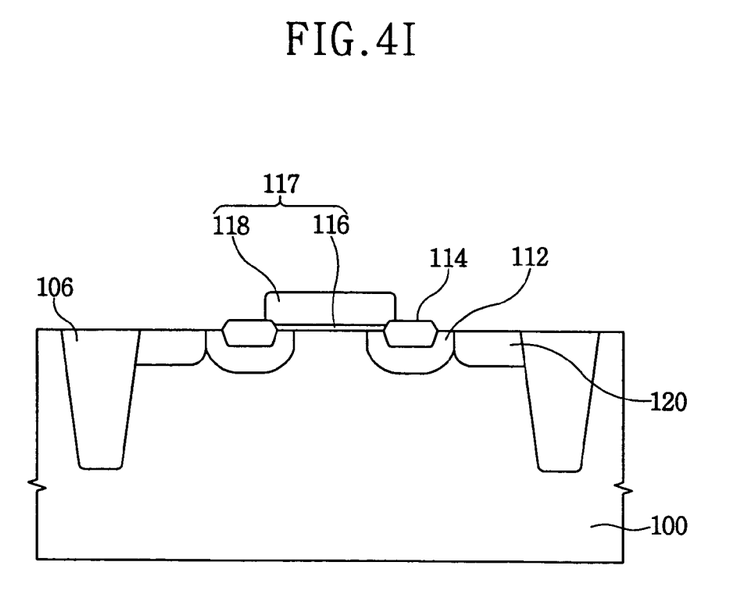

Referring to FIG. 4I, a photoresist film is also coated on an entire surface of the substrate 100, and a photoprocess is performed on the photoresist film in such a pattern that some portion of the substrate that is to be heavily doped source/drain regions is opened between the protective oxide layer 114 and the insulation layer 106. An implantation process is performed and a plurality of ions is implanted onto the exposed portions of the substrate 100 with sufficient energy for forming a heavily doped region at a surface portion of the substrate 100. Therefore, an n$^+$/p$^+$ region 120 that is a heavily doped region is formed at a surface portion of the substrate 100 between the protective oxide layer 114 and the insulation layer 106. A pair of the n$^+$/p$^+$ region 120 forms the heavily doped source/drain regions with which a conductive line of an electric circuit in the transistor makes contact.

According to the present invention, an oxide layer is partially formed at the lightly doped region, so that the lightly doped region is prevented from being damaged in a subsequent process and the effective channel length is elongated to thereby increase the breakdown voltage of the electric field effect transistor. In addition, the electric field is prevented from being concentrated to a bottom portion of the gate structure, so that the generation of hot carriers is suppressed to thereby increase the breakdown voltage of the electric field effect transistor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a transistor with a high breakdown voltage, comprising:
    defining an active region on a semiconductor substrate by an isolation layer formed in a trench with an insulation material;
    selectively etching a surface portion of the active region, thereby forming at least one recessed portion in the active region of the substrate;
    depositing an oxide material on a surface of the substrate, thereby forming an oxide layer with which the recessed portion is filled;
    lightly implanting ions into the recessed portion of the substrate including the oxide layer, thereby forming lightly doped source/drain regions at surface portions of the recessed portion;
    removing the oxide layer except for a portion of the oxide layer corresponding to the recessed portion, thereby forming a protective oxide layer on the recessed portion;
    forming a gate structure between the protective oxide layers; and
    heavily implanting ions into the substrate between the protective oxide layer and the insulation layer, thereby forming heavily doped source/drain regions on the semiconductor substrate.

2. The method of claim 1, wherein defining an active region includes:
    forming a pad oxide layer on the semiconductor substrate;
    forming a nitride layer on the pad oxide layer;
    selectively etching the nitride layer, thereby partially exposing a surface of the pad oxide layer;
    etching the exposed pad oxide layer and the substrate under the exposed pad oxide layer, thereby forming a trench at a surface portion of the substrate;
    depositing an insulation material on the nitride layer and in the trench, thereby forming an insulation layer thereon, the trench being filled with the insulation material;
    removing the insulation layer from the nitride layer; and
    removing the nitride layer and the pad oxide layer from the substrate.

3. The method of claim 2, wherein forming a pad oxide layer is performed by a dry oxidation process under a condition that oxide is supplied to a surface of the substrate at a temperature of about 900° C. to about 1200° C.

4. The method of claim 2, further comprising thermally treating the semiconductor substrate in an oxidation atmosphere after etching the exposed pad oxide layer and the substrate, so that the substrate on the surface portion of which the trench is formed is cured.

5. The method of claim 2, wherein removing the insulation layer is performed by carrying out a chemical mechanical polishing (CMP) process on a surface of the insulation layer using the nitride layer as a stopper.

6. The method of claim 1, wherein forming a gate structure comprises:
    forming a dielectric layer on the semiconductor substrate on which the protective oxide layer is formed;
    forming a conductive layer on the dielectric layer; and
    removing the dielectric layer and the conductive layer except for a portion of the dielectric layer and the conductive layer corresponding to the protective oxide layer.

7. The method of claim 6, wherein forming a dielectric layer comprises:
    growing a dielectric on the substrate in an oxidation atmosphere at a high temperature; and
    depositing a same material as the dielectric layer on the substrate.

8. A method of manufacturing a transistor having a high breakdown voltage, comprising:
    filling a trench for isolating devices with insulation material, thereby defining an active region on a semiconductor substrate;
    selectively etching a surface portion of the substrate in the active region, thereby forming a recessed portion at left and right portions of the substrate in the active region;
    forming a screen oxide layer on the substrate including the recessed portion;
    lightly implanting ions to the recessed portion including the screen oxide layer, thereby forming lightly doped source/drain regions at surface portions of the recessed portion;
    removing the screen oxide layer, thereby exposing a surface portion of the substrate on which the recessed portion is formed;
    depositing an oxide material on the surface portion of the substrate, thereby filling the recessed portion with the oxide material;
    removing the oxide material from the surface of the substrate in the active region except for the oxide material with which the recessed portion is filled, thereby forming a protective oxide layer on a surface of the recessed portion;
    forming a gate structure between the protective oxide layers;
    heavily implanting ions to the substrate, thereby forming heavily doped source/drain regions on surface portions between the protective oxide layer and the insulation layer.

9. The method of claim 8, wherein forming a screen oxide layer is performed by a dry oxidation process under a condition that oxide is supplied to a surface of the substrate at a high temperature.

* * * * *